United States Patent [19]
Debbins et al.

[11] Patent Number: 6,108,573
[45] Date of Patent: Aug. 22, 2000

[54] REAL-TIME MR SECTION CROSS-REFERENCE ON REPLACEABLE MR LOCALIZER IMAGES

[75] Inventors: Josef P. Debbins, Waukesha; William J. Balloni, Menomonee Falls; Paul E. Licato, Wauwatosa, all of Wis.

[73] Assignee: General Electric Co., New York, N.Y.

[21] Appl. No.: 09/199,687

[22] Filed: Nov. 25, 1998

[51] Int. Cl.[7] ............................................. A61B 5/055
[52] U.S. Cl. ...................... 600/410; 324/309; 345/115; 345/145; 345/157; 345/326
[58] Field of Search ............................ 600/410, 425, 600/437; 378/4, 901; 345/115, 326, 156–157, 161, 163, 167, 145; 324/309, 318, 322

[56] References Cited

U.S. PATENT DOCUMENTS

| | | | |
|---|---|---|---|
| 5,501,218 | 3/1996 | Usui | 600/410 |
| 6,016,438 | 1/2000 | Wakayama | 600/410 |

*Primary Examiner*—Ruth S. Smith
*Attorney, Agent, or Firm*—Foley & Lardner

[57] ABSTRACT

A method and apparatus for producing an imaging plane on a primary, real-time image of a structure positioned in a MRI system having a display screen and an input device. An operator interactively acquires the primary, real-time image of a planar section of the structure of interest, such as an anatomical structure. Using an input device, the operator initiates the acquisition of a first localizer data set from the same orientation as the primary, real-time image of the structure under study. The present invention then acquires such data as a first localizer image and displays such image along side the primary, real-time image on a display screen of the MRI system. The present invention then acquires a second and third localizer data sets which are orthogonal to the primary, real-time image and to each other and generating and displaying said second and third localizer image. All three localizer images are displayed in three separate displays along side the primary, real-time image of the structure of interest with each localizer image having a graphic cross-reference, typically a line, which depicts the intersection of the primary, real-time image in each of the mutually orthogonal localizer images. The operator of the present invention may then see the relative position of the primary, real-time image plane of the structure of interest relative to the mutually orthogonal views of such structure of interest.

13 Claims, 7 Drawing Sheets

Fig 3. scout and prescribe*
1) Three planar scouts are acquired, and graphic prescription used to prescribe the subsequent imaging sections/volume....
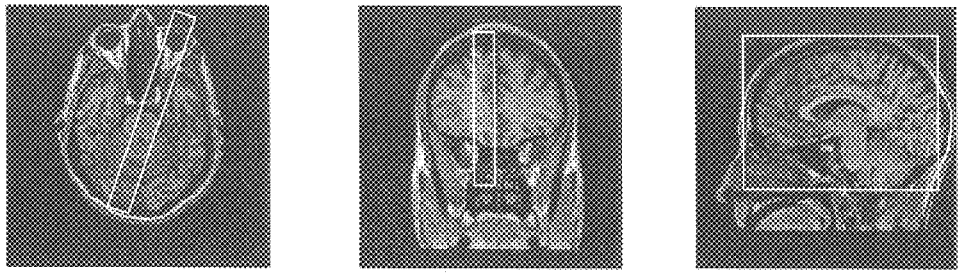
2) the subsequent oblique imaging sections/volume.
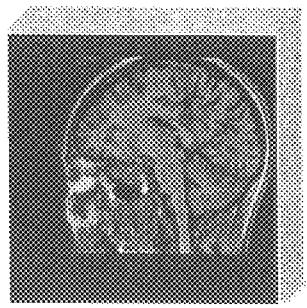
*prior art

Fig 4. pixel reformatting*
1) from the section/volumar pixel data, a specific oblique projection can be identified...
2) shown for reference is the intersection of the desired projection and and a reference data set depicts the
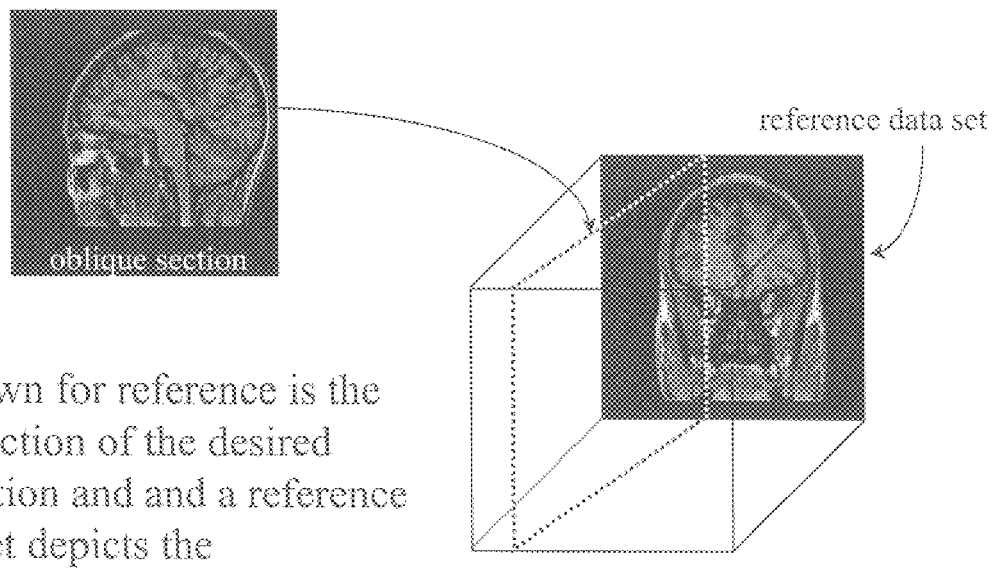
reference data set
*prior art

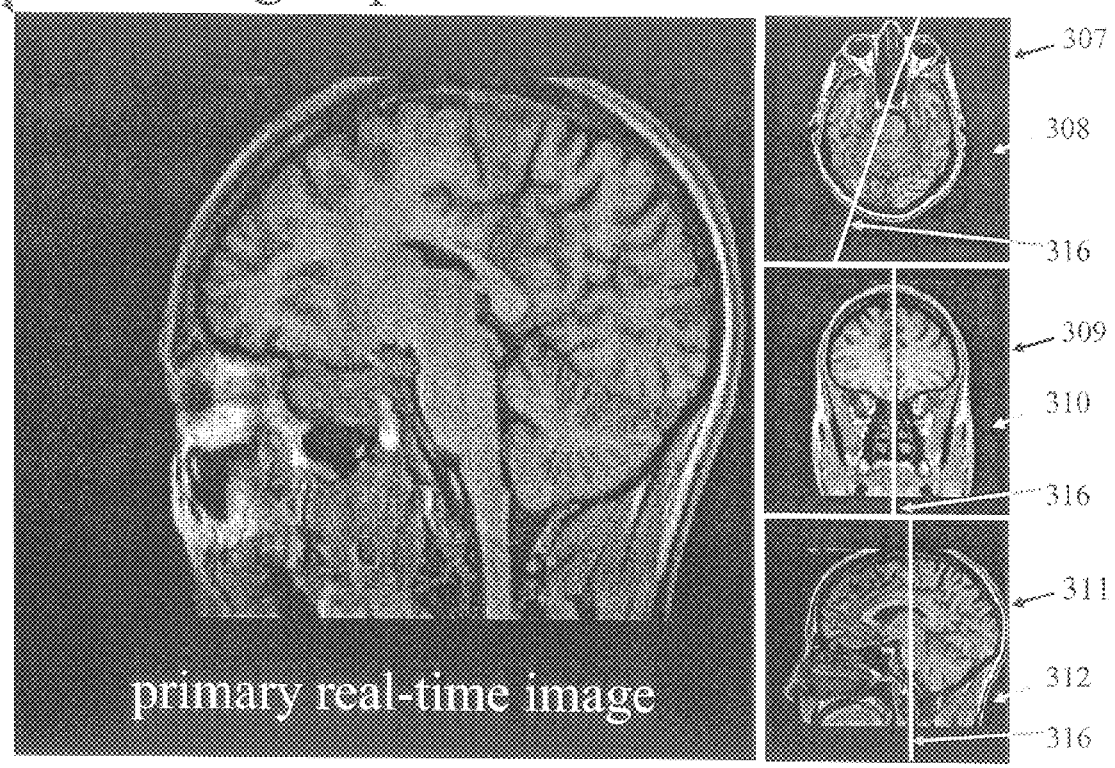

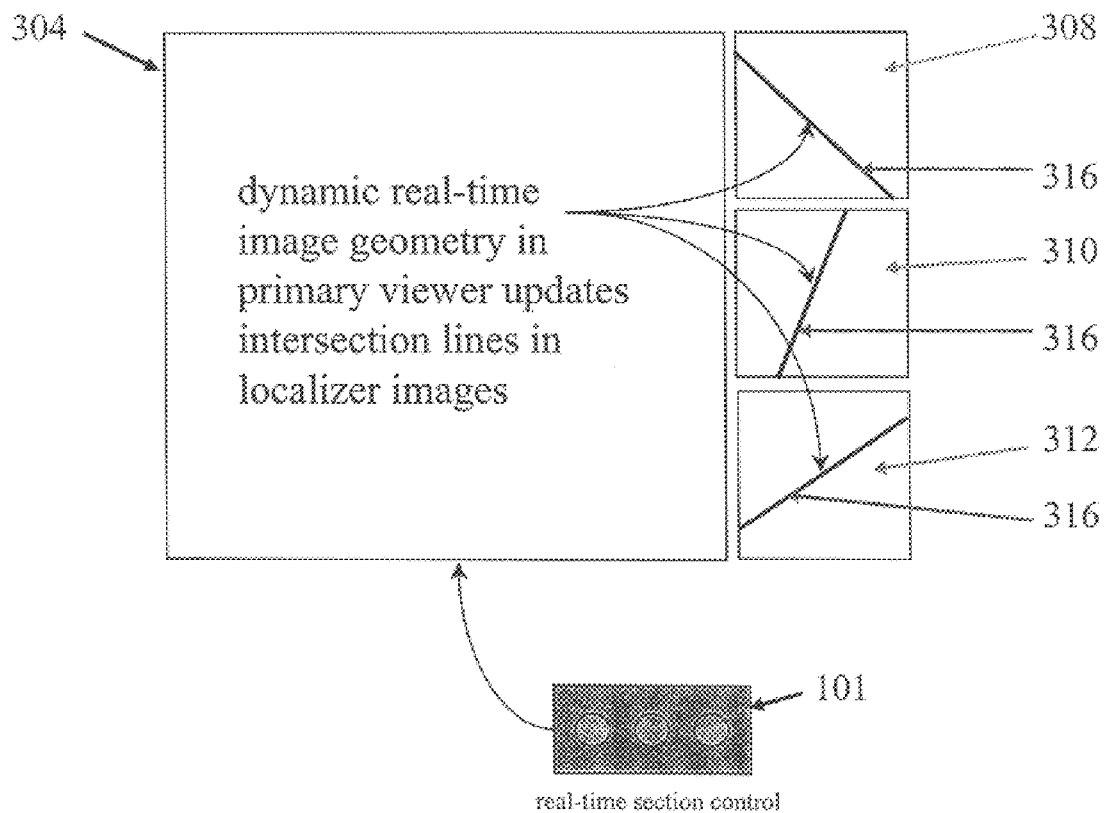

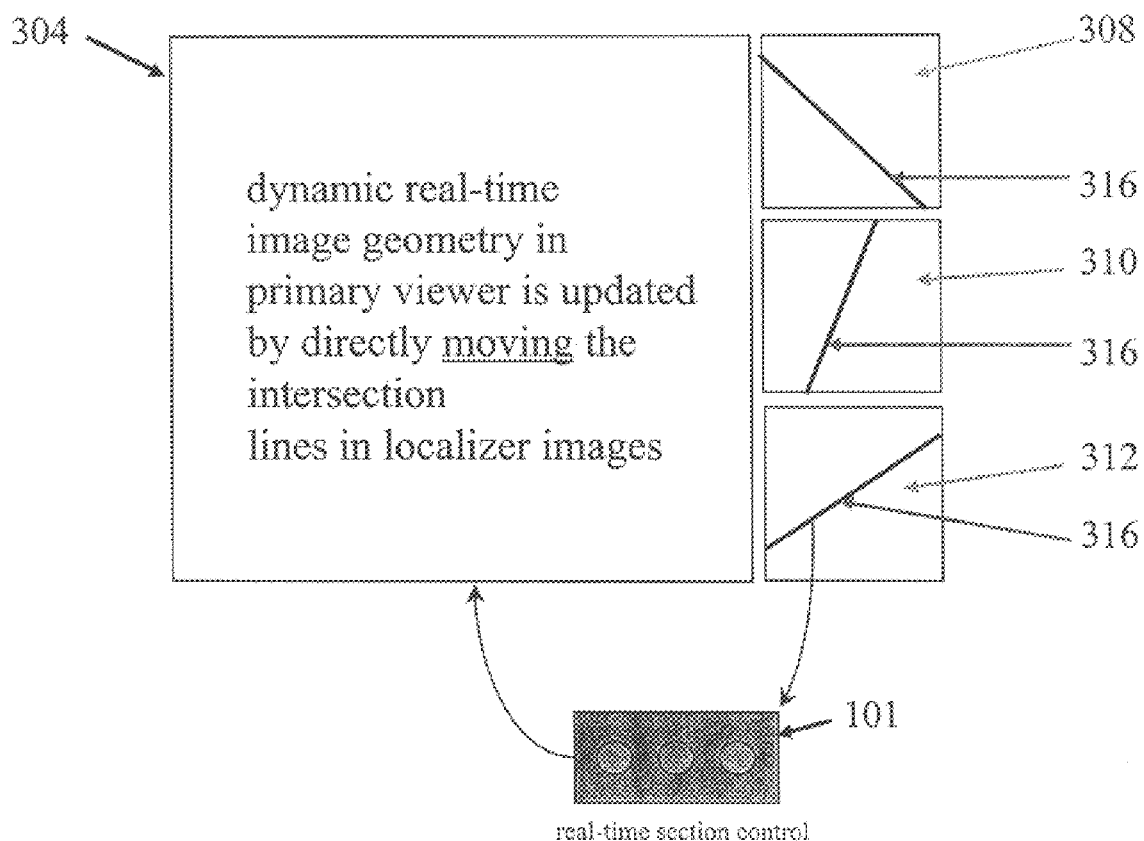

REAL-TIME MR SECTION CROSS-REFERENCE ON REPLACEABLE MR LOCALIZER IMAGES

FIELD OF THE INVENTION

The field of the invention is nuclear magnetic resonance imaging methods and systems. More particularly, the invention relates to MRI imaging systems equipped for real-time imaging and methods for assisting the operator to interactively position the excitation profile for subsequent acquisition of the desired anatomical imaging section.

BACKGROUND OF THE INVENTION

When a substance such as human tissue is subjected to a uniform magnetic field (polarizing field Bo), the individual magnetic moments of the spins in the tissue attempt to align with this polarizing field, but process about it in random order at their characteristic Larmor frequency. If the substance, or tissue, is subjected to a magnetic field (excitation field $B_1$) which is the x-y plane and which is near the Larmor frequency, the net aligned moment, Mz, may be rotated, or "tipped", into the x-y plane to produce a net transverse magnetic moment M. A signal is emitted by the excited spins after the excitation signal $B_1$ is terminated and this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

When attempting to define the volume of coverage for an MRI scan, the NMR system operator may desire to prescribe a specific two dimension scan plane within the total volume of coverage. This process can be particularly useful when prescribing a double oblique, off axis two dimensional scan plane of complex anatomy such as vasculature.

Typically, an operator must first acquire an axial, sagittal or coronal "scout" image of the structure of interest. Such scout image is then displayed and the operator uses such scout image to graphically prescribe the 2D section or 3D imaging volume. Three-plane localizer acquisitions have been developed which quickly acquire standard orthogonal scout images and then display such images with graphic prescription overlay tools. Such procedure allows the operator to rapidly prescribe subsequent acquisition imaging volumes of the structure of interest. FIG. 3 depicts the prior art which uses scout images and prescribe process using those orthogonal planes.

Following data acquisition the MR system reformats the previously acquired volume data set. Such reformatting is accomplished by pixel data post-processing. Such reformatted volume data set is used to display a particular projection or image plane, a reference image or a set of orthogonal reference images as determined by the operator. Such image is usually displayed with an intersection reference line. The intersection reference line is updated to reflect the position of the projection or visualization plane of the image of the structure of interest. FIG. 4 depicts the prior art process of such reformat and intersection reference line display which is performed following data acquisition.

SUMMARY OF THE INVENTION

In accordance with the present invention, Applicant provides a method and apparatus for producing an imaging plane on a primary, real-time image of a structure positioned in a MRI system having a display screen and an input device. An operator interactively acquires the primary, real-time image of a planar section of the structure of interest, such as an anatomical structure. Using an input device, the operator initiates the acquisition of a first localizer data set from the same orientation as the primary, real-time image of the structure under study. The present invention then acquires such data as a first localizer image and displays such image along side the primary, real-time image on a display screen of the MRI system. The present invention then acquires second and third localizer data sets which are orthogonal to the primary, real-time image and to each other and generating and displays said second and third localizer images. All three localizer images are displayed in three separate displays along side the primary, real-time image of the structure of interest with each localizer image having a graphic, cross-reference, typically a line, which depicts the intersection of the primary, real-time image in each of the mutually orthogonal localizer images. The operator of the present invention may then see the relative position of the primary, real-time image plane relative to the mutually orthogonal views of such structure of interest.

A principal feature of the present invention is the ability to update the mutually orthogonal views of the structure of interest at any time during the real-time scanning process.

Another important feature of the present invention is the real-time coupling between the graphic cross-reference on each of the localizer images with the primary, real-time image of the structure of interest.

Another important feature of the present invention is the ability to select one of the three localizer images and thereby causing such localizer image to become the then current primary, real-time image of the structure of interest.

A further object of the present invention is the ability to manipulate the graphic cross-reference directly on any of the three localizer images with a corresponding update of the primary, real-time image geometry and graphic cross-reference on the other two localizer images.

It is an additional object of the present invention to rapidly localize views on an image of a structure of interest displayed on a screen of a MRI system. Other principal features and advantages of the present invention will become apparent to those skilled in the art upon review of the following drawings, the detailed description and the appended claims.

BRIEF DESCRIPTION OF THE DRAWINGS

FIG. 3 is an illustration of the prior art which uses "scout" images and the prescribe process using three orthogonal previously acquired images.

FIG. 4 is an illustration of the prior art which depicts the reformat and intersection reference line process following data acquisition.

FIG. 5 illustrates an actual implementation of the present invention imaging a human head.

FIG. 6 illustrates the real-time updating of the section cross-references on the localizer images.

FIG. 7 illustrates the real-time control of the primary imaging plane using the cross-reference lines on the localizer images.

Figure 1:
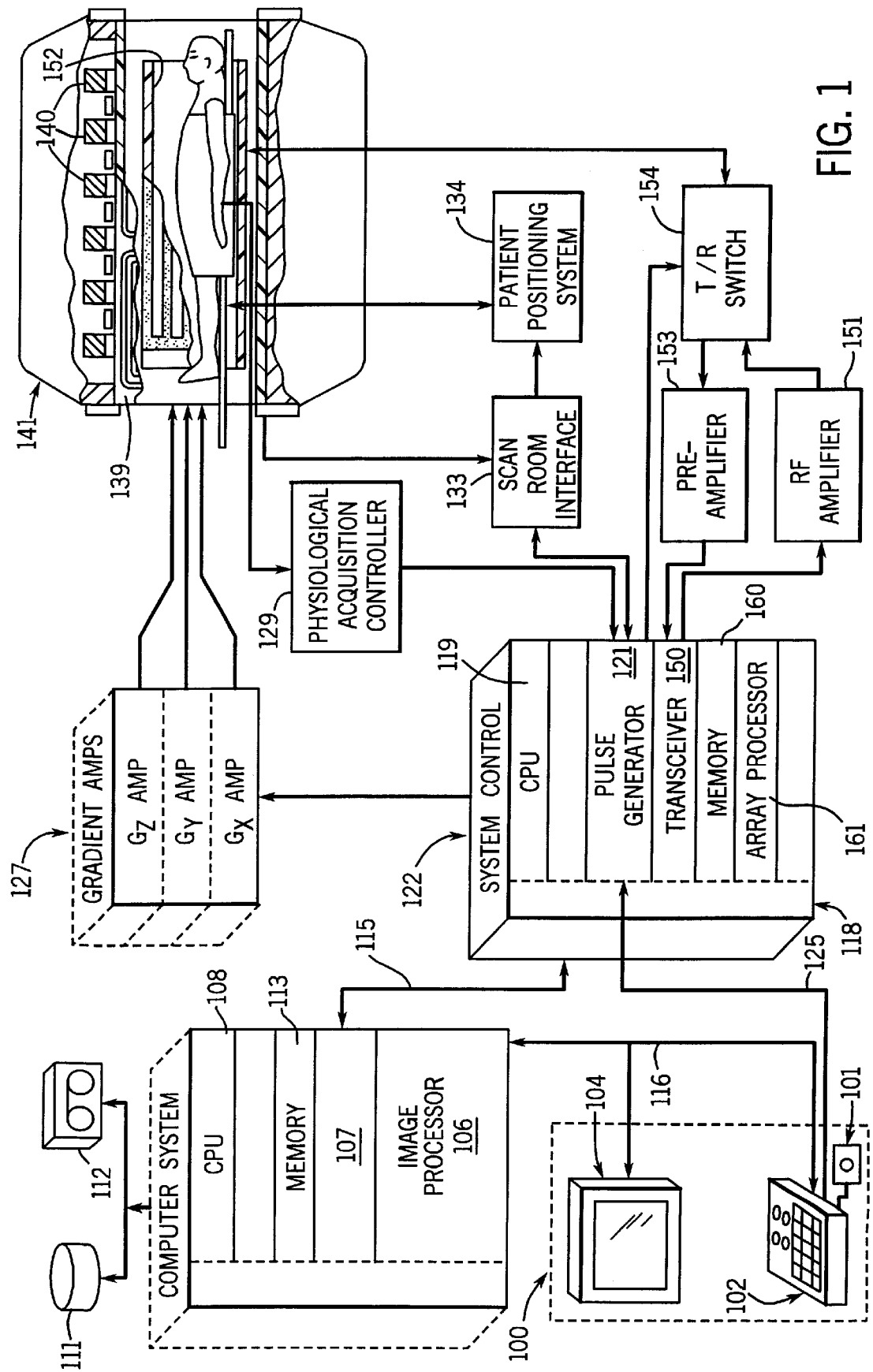
FIG. 1 is a block diagram of an MRI system which employs the present invention.

Before explaining the preferred embodiment of the invention in detail it is to be understood that the invention is not limited in its application to the details of construction and the arrangement of the components set forth in the following description as illustrated in the drawings. The invention is capable of other embodiments or being practiced or carried out in various ways. Also, it is to be understood that the phraseology and terminology employed herein is for the purpose of description and should not be regarded as limiting.

DETAILED DESCRIPTION OF THE PREFERRED EMBODIMENT

Referring first to FIG. 1, there is shown the major components of a preferred MRI system which incorporates the present invention. The operation of the system is controlled from an operator console 100 which includes an input device 101, a control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152.

A transceiver module 150 in the system control 122 produces pulses which are amplified by an RF amplifier 151 and coupled to the RF coil 152 by a transmit/receiver switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
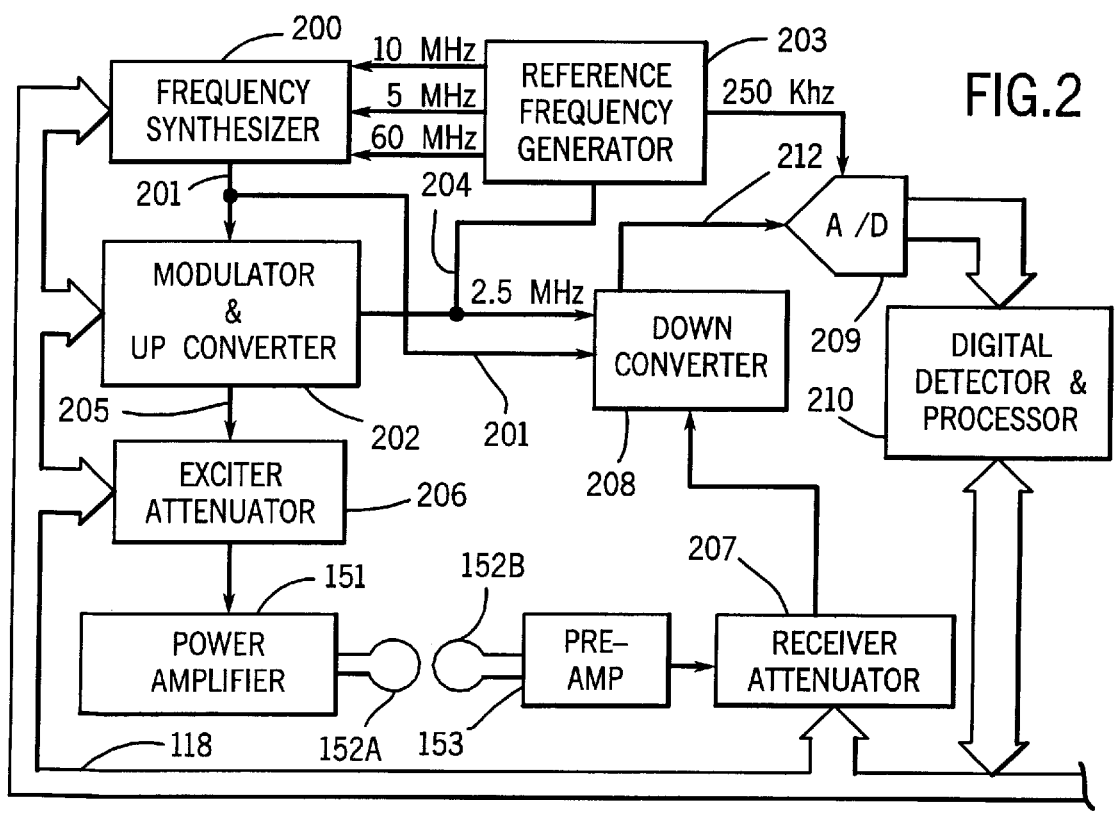
FIG. 2 is an electrical block diagram of the transceiver which forms part of the MRI system of FIG. 1.

Referring particularly to FIGS. 1 and 2, the transceiver 150 produces the RF excitation field $B_1$ through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals (CF) from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 1 and 2 the NMR signal produced by the subject is picked up by the receiver coil 152B and applied through the preamplifier 153 to the input of a receiver attenuator 207. The receiver attenuator 207 further amplifies the signal by an amount determined by a digital attenuation signal (RA) received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. The down converted NMR signal is applied to the input of an analog-to-digital (A/D) converter 209 which samples and digitizes the analog signal and applies it to a digital detector and signal processor 210 which produces 16 bit in-phase (I) values and 16-bit quadrature (Q) values corresponding to the received signal. The resulting stream of digitized I and Q values of the received signal are output through backplane 118 to the memory module 160 where they are normalized in accordance with the present invention and then employed to reconstruct an image.

The 2.5 MHz reference signal as well as the 250 kHz sampling signal and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

To practice the present invention, an operator maneuvers a two dimensional scan plane through the structure of interest, typically an anatomical structure such as the heart or head of a human being. Such maneuvering is accomplished from the operator console 100 using an input device 101. The input device 101 is selected from a group including a mouse, a joystick, a keyboard, a track ball, a voice control, a touch screen and a light wand. The MR imaging system of the present invention is capable of imaging in any desired orientation within the structure of interest and is equipped to perform both real-time acquisition or non-real-time acquisition of images. In particular, real-time refers to continuous acquisition and reconstruction of MR image data as rapidly as it is acquired by the MRI system. A real-time MR image can be acquired, processed and displayed in approximately one second or less as limited by system performance. The real-time MRI system localizes planar sections and imaging volumes of the structure of interest without the need for a preliminary data set.

The present invention provides a method and apparatus for displaying the relative position of an imaging plane, also referred to as an acquisition plane, of a primary real-time image 304 of a structure positioned in an MRI system relative to mutually orthogonal views of such structure of interest. The structure of interest may be and typically is an anatomical structure of a human body. FIG. 5 illustrates an actual implementation of the present invention imaging a human head.

Referring now to FIGS. 5, 6 and 7, an operator interactively acquires the primary, real-time image 304 of a planar section of the structure of interest and displaying such image on the display screen 104. The operator then initiates the acquisition of a first localizer data set from the same orientation as the primary real-time image 304 using the input device 101 which is then displayed as a first localizer image 307. A present invention then acquires a second localizer data set from an imaging section of the structure of interest which is orthogonal to the primary real-time image 304 which is then displayed as a second localizer image 309. And finally, the present invention acquires a third localizer data set which is then displayed as an imaging section of the structure of interest which is orthogonal to the primary real-time image 304 and the second localizer data set which is then displayed as a third localizer image 311. The present invention displays the first, second and third localizer images 307, 309 and 311 in corresponding three separate displays, 308, 310 and 312 on the display screen 104 with the image of the primary real-time image 304 of the structure of interest and provides a graphic cross-reference 316 on each of the displayed localizer images 307, 309 and 311 depicting the intersection of the primary real-time image 304 and each of the mutually orthogonal localizer images. Each of said localizer images 307, 309 and 311 are replaceable as determined by the operator using the input device 101. The operator selects and maneuvers the imaging section of the structure of interest by using an input device 101 selected from a group including a mouse, a joystick, a keyboard, a track ball, a voice control, a touch screen and a light wand. In a typical operation, the operator, using the input device, such as a mouse, "clicks" on a graphic user interface displayed on the display screen 104 which invokes routines on the CPU 108 in the computer system of the MRI system. The CPU 108 then executes the instruction, calculating the desired image planar section, rotation and offset parameters and sends the appropriate parameters to the pulse generator 121 in the control system 122 of the MRI system. Each of said localizer images 307, 309 and 311 are replaceable as determined by the operator using the input device 101. The present invention can then repeat the method of acquiring the three localizer data sets and the processing in the computer a plurality of times to produce a corresponding plurality of replaceable localizer images.

The present invention also provides the operator with the ability to manipulate the graphic cross-reference 316 directly on any of the three localizer images 307, 309 and 311 displayed in the corresponding displays 308, 310 and 312 on the display screen 104. The present invention then automatically updates the position of the primary real-time image 304 as well as the graphic cross-reference 316 on the other localizer images. The present invention allows the MRI system operator to see the relative position of the imaging plane of the structure of interest as depicted in the primary, real-time image 304 relative to the mutually orthogonal views of the localizer images 307, 309 and 311.

The operator, using the input device 101, may also select one of the three localizer images 307, 309 and 311 to cause such localizer image to then become the primary, real-time image. The computer system of the MRI system then updates the graphic cross-references on the localizer images displayed on the display screen 104 in real-time.

An important distinction between the present invention and the prior art is that all of the images, the three localizer images 307, 309 and 311, and the primary, real-time image 304, are generated in real-time and the graphic cross-reference 316 displayed on each of the image displays 308, 310 and 312 are updated in real-time to reflect the geometry of the primary, real-time image 304 under control of the operator at the operator console 100. The present invention provides real-time coupling between the graphic cross-reference 316 and the primary, real-time image being acquired by the MRI system.

Thus, it should be apparent that there has been provided in accordance with the present invention a method and apparatus for producing a real-time MR section graphic cross-reference on replaceable MR localizer images on an image section of a structure of interest positioned in a MRI system that satisfies the objectives and advantages set forth above. Although the invention has been described in conjunction with specific embodiments thereof, it is evident that alternatives, modifications and variations will be apparent to those ordinarily skilled in the art. Accordingly, it is intended to embrace all such alternatives, modifications and variations that fall within the spirit and scope of the appended claims.

What is claimed is:

1. A method for producing an indication of an imaging plane of a primary, real-time image of a structure positioned in a MRI system having a display screen, the steps comprising:
   (a) interactively acquiring the primary, real-time image of a planar section of the structure of interest and displaying such image on the display screen;
   (b) acquiring a first localizer data set from the same orientation as the primary real-time image and displaying such data as a first localizer image;
   (c) acquiring a second localizer data set from an imaging section of the structure of interest which is orthogonal to the primary, real-time image and displaying such data set as a second localizer image;
   (d) acquiring a third localizer data set from an imaging section of the structure of interest which is orthogonal to the primary, real-time image and the second localizer data set and displaying such third localizer data set as a third localizer image;
   (e) displaying the first, second, and third localizer images in corresponding three separate displays on the display screen with the image of the primary, real-time image of the structure of interest; and
   (f) providing a graphic cross-reference on each of the displayed localizer images depicting the intersection of the primary, real-time image and each of the mutually orthogonal localizer images.

2. The method as recited in claim 1, including the steps of updating the graphic cross-reference on each of said localizer images in real-time as the primary, real-time image of the structure of interest is maneuvered to a new orientation and positioned on the display screen.

3. The method as recited in claim 1, in which the steps of (b) through (f), inclusive, are repeated a plurality of times to produce a corresponding plurality of localizer images.

4. The method as recited in claim 1, wherein the structure of interest is an anatomical structure.

5. The method of claim 1, including the step of manipulating the graphic cross-reference directly on any of the three localizer images with a corresponding update of the primary, real-time image and the graphic cross-references on the other two localizer images.

6. The method of claim 1, including the step of selecting one of the three localizer images and directly causing such localizer image to become the primary, real-time image.

7. The method as recited in claim 1, wherein the steps of (b), (c) and (d) are performed by an input device selected from a group consisting of a mouse, a joystick, a keyboard, a track ball, a voice control, a touch screen and a light wand.

8. An apparatus for producing an indication of an imaging plane of a primary, real-time image of a structure positioned in a MRI system having a display screen, the apparatus comprising:
   (a) a means for interactively acquiring the primary, real-time image of a planar section of the structure of interest and displaying such image on the display screen;
   (b) a means for acquiring a first localizer data set from the same orientation as the primary real-time image and displaying such data as a first localizer image;
   (c) a means for acquiring a second localizer data set from an imaging section of the structure of interest which is orthogonal to the primary, real-time image and displaying such data set as a second localizer image;
   (d) a means for acquiring a third localizer data set from an imaging section of the structure of interest which is orthogonal to the primary, real-time image and the second localizer data set and displaying such third localizer data set as a third localizer image;
   (e) a means for displaying the first, second, and third localizer images in corresponding three separate displays on the display screen with the image of the primary, real-time image of the structure of interest; and
   (f) a means for providing a graphic cross-reference on each of the displayed localizer images depicting the intersection of the primary, real-time image and each of the mutually orthogonal localizer images.

9. The apparatus as recited in claim 8, including a means for updating the graphic cross-reference on each of said localizer images in real-time as the primary, real-time image of the structure of interest is maneuvered to a new orientation and positioned on the display screen.

10. The apparatus as recited in claim 8, wherein the structure of interest is an anatomical structure.

11. The apparatus of claim 8, including a means for manipulating the graphic cross-reference directly on any of the three localizer images with a corresponding update of the primary, real-time image and the graphic cross-references on the other two localizer images.

12. The apparatus of claim 8, including a means for selecting one of the three localizer images and directly causing such localizer image to become the primary, real-time image.

13. The apparatus as recited in claim 8, further comprising a means for initiating acquisition of the localizer data sets, wherein the means for initiating acquisition comprises an input device selected from a group consisting of a mouse, a joystick, a keyboard, a track ball, a voice control, a touch screen and a light wand.

* * * * *